United States Patent [19]
Hwu et al.

[11] Patent Number: 5,527,397
[45] Date of Patent: Jun. 18, 1996

[54] PHOTOELECTRIC CONVERSION DEVICE

[75] Inventors: Jenn-Gwo Hwu; Jim-Haw Lee; Shu-Jim Wang, all of Taipei, Taiwan

[73] Assignee: National Science Council, Taipei, Taiwan

[21] Appl. No.: 353,830

[22] Filed: Dec. 12, 1994

[51] Int. Cl.$^6$ .......................... H01L 31/062; H01L 31/18
[52] U.S. Cl. ............................ 136/255; 257/431; 437/2
[58] Field of Search ........................... 136/244, 255; 257/431; 437/2–5

[56] References Cited

U.S. PATENT DOCUMENTS

| | | | |
|---|---|---|---|
| 3,422,527 | 1/1969 | Gault | 437/2 |
| 4,082,570 | 4/1978 | House et al. | 136/246 |

OTHER PUBLICATIONS

B. L. Sater et al., *Conference Record, 11th IEEE Photovoltaic Specialists Conf.* (1975), pp. 356–363.

*Primary Examiner*—Aaron Weisstuch
*Attorney, Agent, or Firm*—Frost & Jacobs

[57] ABSTRACT

The present photoelectric conversion device includes a photo-receiving surface generating electron-hole pairs due to a distortion of an energy band thereof after receiving light, and two contacts contacting the photo-receiving surface for separating the electron-hole pairs. By this disclosure, a cost-effective, easily-makable photoelectric conversion device made by a clean manufacturing process is provided. A preferred MOS photoelectric conversion device of the present invention is made by using a silicon substrate having an upper surface and a lower surface, growing an oxide layer on the upper surface of the silicon substrate, forming a first metal contact layer on said oxide layer, forming a second metal contact layer on the lower surface of the silicon substrate, and breaking the MOS structure into several parts each having a broken surface to serve as a photo-receiving surface.

15 Claims, 10 Drawing Sheets

PHOTOELECTRIC CONVERSION DEVICE

FIELD OF THE INVENTION

The present invention is related to a conversion device, and more particularly to a photoelectric conversion device.

BACKGROUND OF THE INVENTION

The principle of a semiconductor solar cell is described as follows.

A solar cell device generates electron-hole pairs after it receives light. The electron-hole pairs are separated by an electric field built into the device, and then guided outwards by two metal electrodes of the device. In this way, a phenomenon of charge flow appears to provide a current. Thus, as long as the energy gap of a material is suitable and formation of the electric field possible, the material may be used for manufacturing a solar cell.

A few decades ago when semiconductor solar cells were manufactured and researched, a variety of materials for the solar cells were developed, such as homo- and hetero- p-n junctions, metal-insulator-semiconductor diodes, metal semiconductor diodes, etc.

No matter which kind of material is used for manufacturing a solar cell, the materials receive light at their principal surfaces to generate the photoelectric conversion effect. Thus, specific metal contact patterns are required, whereby the cost is increased. Furthermore, the aforementioned conventional solar cell structures have p-n junctions which are fabricated in the presence of costly and poisonous gases. For example, $AsH_3$ and $B_2H_6$ are respectively used as n- and p-type dopants, and $SiH_4$ is used for the deposition of amorphous silicon. In short, the conventional solar cells have disadvantages of not only high manufacturing cost but also bad effects on the environment.

SUMMARY OF THE INVENTION

An object of the present invention is to provide a cost-effective photoelectric conversion device.

Another object of the present invention is to provide an easily-manufactured photoelectric conversion device.

Another object of the present invention is to provide a photoelectric conversion device via an environmentally clean manufacturing process.

In accordance with the present invention, a photoelectric conversion device includes a photo-receiving surface generating electron-hole pairs due to a distortion of the energy band thereof after absorbing light, and two contacts contacting the photo-receiving surface for separating the electron-hole pairs. The photo-receiving surface includes a first portion of a substrate positioned between the two contacts, and a second portion of an oxide layer positioned between the substrate and one of the contacts, wherein the substrate is a p-type or n-type silicon layer, the oxide layer is a $SiO_2$ layer, and the contact ends are respectively a first metal, e.g. Al, layer and a second metal, e.g. Al, layer. In addition, the photo-receiving surface may be a broken surface obtained by cutting a MOS-structure body or results from a natural cleavage of a MOS-structure body.

In accordance with another aspect of the present invention, the photoelectric conversion device further includes an anti-reflection layer covering the photo-receiving surface to reduce the amount of light-reflection at the photo-receiving surface.

The photoelectric conversion device is used as a solar cell, and it also may be used as a photo detector.

In accordance with another aspect of the present invention, a method for manufacturing the photoelectric conversion device includes the steps of: (a) providing a silicon substrate having an upper surface and a lower surface; (b) growing an oxide layer on the upper surface; (c) forming the first metal layer on the oxide layer; (d) forming the second metal layer on the lower surface of the silicon substrate to obtain a MOS-structure body; and (e) breaking the MOS-structure body into several parts, each having a broken surface serving as the photo-receiving surface to generate the electron-hole pairs after the photo-receiving surface receives light. The oxide layer in step (b) is grown preferably in a dry oxygen atmosphere at 1000° C., and steps (c) and (d) are preferably performed by evaporating.

The present invention may best be understood through the following description with reference to the accompanying drawings, in which:

DETAILED DESCRIPTION OF THE PREFERRED EMBODIMENT

The present invention will now be described more specifically with reference to the following embodiment. It is to be noted that the following descriptions of preferred embodiments of this invention are presented herein for purpose of illustration and description only; they are not intended to be exhaustive and the present invention is not intended to be limited to the precise forms disclosed.

Figure 1:
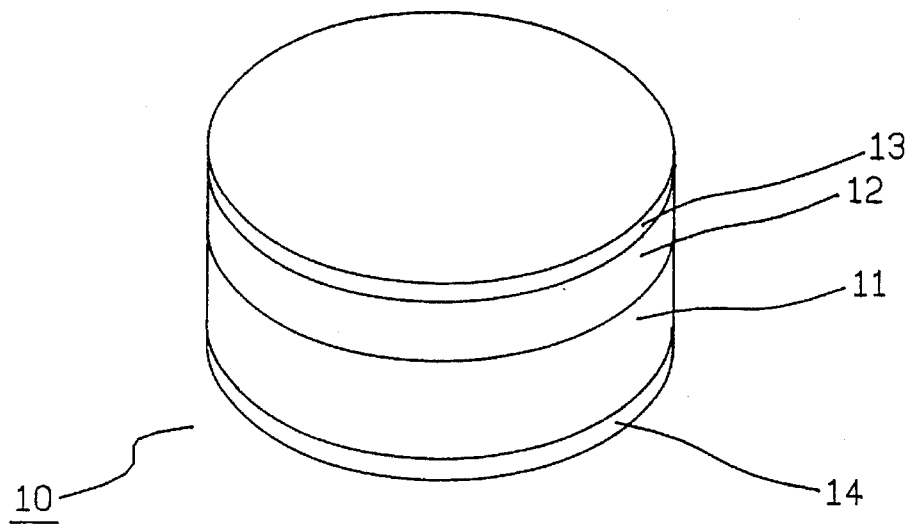
FIG. 1 is a schematic diagram showing a MOS-structure body which is used to manufacture a photoelectric conversion device according to the present invention.

Refer to FIG. 1, which is a schematic diagram showing a MOS-structure body which is used to manufacture a photoelectric conversion device according to the present invention. The MOS-structure body is manufactured by the steps as follows:

(a) providing a p-type silicon substrate 11 having an upper surface and a lower surface;

(b) growing an oxide layer 12 of about 300 Å on the upper surface in a dry oxygen atmosphere at about 1000° C.;

(c) evaporating a first aluminum layer 13 of about 1000 Å on the oxide layer 12;

(d) evaporating a second aluminum layer 14 of about 1000 Å on the lower surface of the silicon substrate 11 to obtain the MOS-structure body 10.

Figure 2:
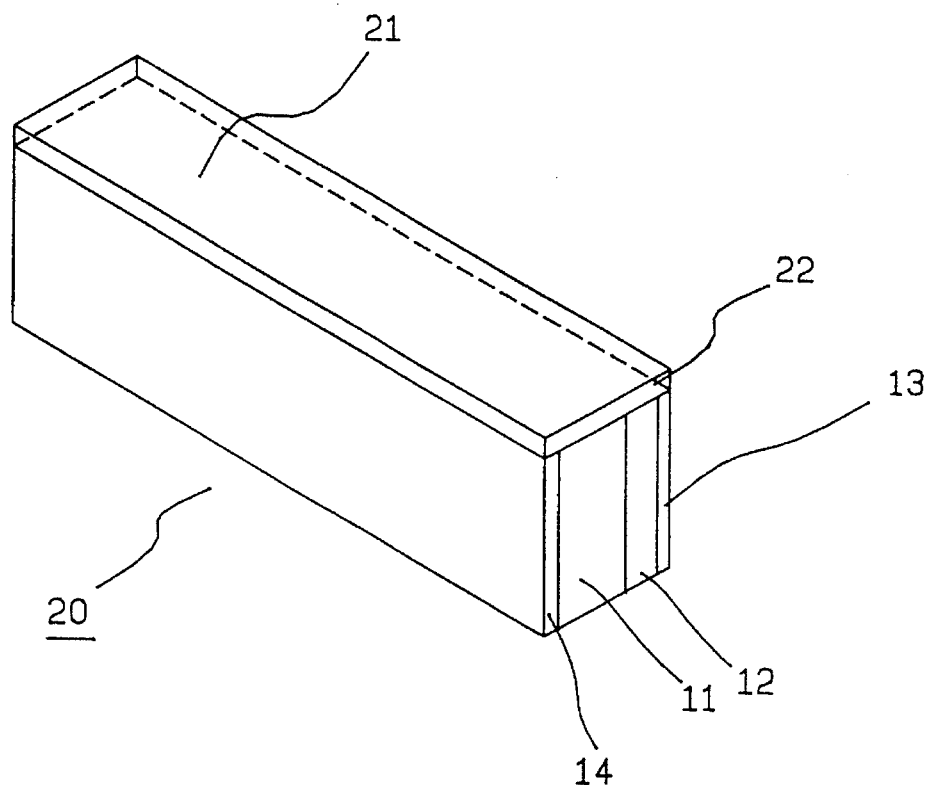
FIG. 2 is a schematic diagram showing a preferred embodiment of a photoelectric conversion device according to the present invention.

Then, the MOS-structure body 10 is cut into or allowed to naturally break so as to form several photoelectric conversion devices 20 each having a broken surface 21 serving as a photo-receiving surface to generate electron-hole pairs after the photo-receiving surface 21 receives light, as shown in FIG. 2. An anti-reflection layer 22 is further provided for covering the photo-receiving surface 21 to reduce the light-reflection from the photo-receiving surface 21.

Figure 3:
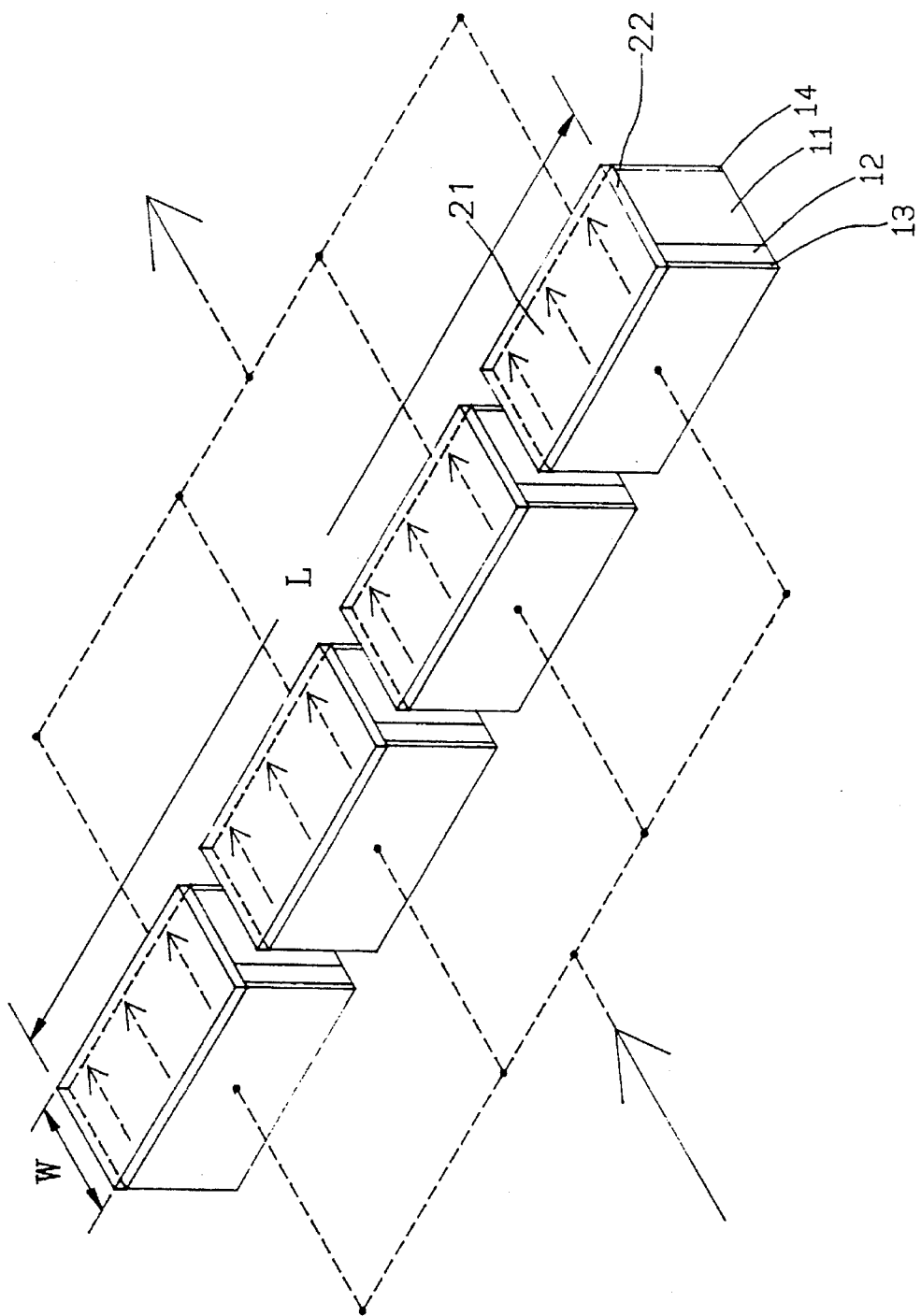
FIG. 3 is a schematic diagram showing four photoelectric conversion devices connected in parallel according to the present invention.

The photoelectric conversion device 20 can be used as a solar cell or a photo diode. When the photoelectric conversion device 20 is used as a solar cell, several photoelectric conversion devices 20 are connected in series or in parallel. In the parallel connected example, as shown in FIG. 3, the photo-receiving surface 21 including a first portion of the silicon substrate 11 and a second portion of the oxide layer 12 receives light and a current is thus obtained at the two aluminum electrodes 13 and 14. The direction of current flow is represented by an arrow.

The conventional metal-insulator-semiconductor solar cell can be categorized as a MOS-structure body. However, the metal-insulator-semiconductor solar cell receives the light at its obverse surface to generate photoelectric conversion caused by a tunneling effect, so the oxide layer thereof cannot be too thick. In general, the allowable thickness of the oxide layer of the metal-insulator-semiconductor solar cell is less than 20 Å. The reason why a metal-oxide-semiconductor (MOS) having a thicker oxide layer (more than 20 Å) has not been used for a solar cell is that the energy gap of silicon oxide is about 9 eV, so that photons present in the sun light cannot cause the silicon oxide to generate electron-hole pairs. That is, a thick oxide layer still remains insulating after it is illuminated by the sun light and no current is generated. The present photoelectric conversion device is obtained from such an MOS-structure body having a thicker oxide layer. The present photoelectric conversion device receives the light at its broken surface labeled as 21 in FIG. 2. The principle is inferred as follows.

The silicon oxide partly forming part of the broken surface still has the electric field therein, wherein the magnitude of the electric field equals the value of the potential drop, across the oxide layer, divided by the thickness of the oxide layer. The energy gap of the silicon oxide of the broken surface is significantly distorted to become less owing to the oxide break. In addition, many energy trap levels within the energy band are produced for the electron jump excited by photons. The excited electrons then move out of the oxide layer 12 along the direction of the electric field and thus the separation of electron-hole pairs is caused. Moreover, electron-hole pairs are generated in the silicon depletion region near the oxide layer 12 under the broken surface 21 due to the light illumination. The electrons flow toward to the aluminum electrode 13 through the oxide layer 12 and the holes flow toward the aluminum electrode 14 through the depletion region. Experimentally, the device current intensity resulting from receiving the light is not proportional to the obverse surface area, but instead, is proportional to the broken surface length. Therefore, it can be assured that the generation of the current is caused by the light reception of the broken surface.

The four photoelectric conversion devices shown in FIG. 3 are called a cell row. The effective photo-receiving area equals "W×L", wherein W represents the thickness of each photoelectric conversion device and L represents the total length of the four photo-receiving surfaces.

Figure 4:
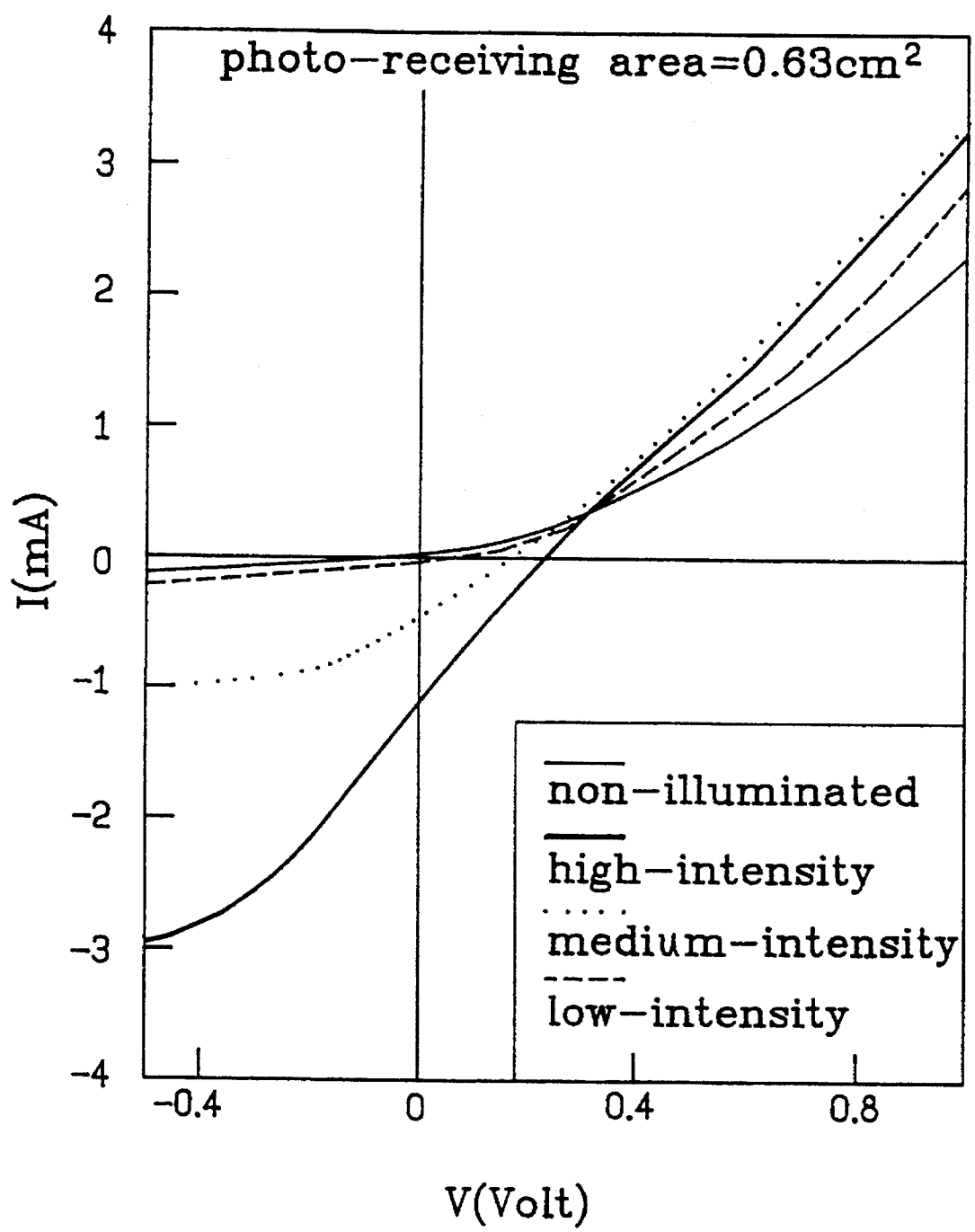
FIG. 4 is an I vs V plot of a photoelectric conversion device according to the present invention before and after the photoelectric conversion device which has a photo-receiving area of 0.63 $cm^2$ receives light of various intensities.

Referring to FIG. 4, which is an I vs V plot of a photoelectric conversion device according to the present invention before and after the device, which has a photo-receiving area of 0.63 cm², receives lights of various intensities. In this case, the effective photo-receiving area, W×L, is 0.63 cm². Using a light bulb having a power of 40 W, the light intensities the photoelectric conversion devices receive were varied with the change of the distances between the devices and the bulb. The measured results are summarized in the following Table 1 and plotted in FIG. 4.

TABLE 1

|    | Isc (mA) | VOC (V) |
|----|----------|---------|
| H. | −1.030   | 0.24    |
| M. | −0.509   | 0.20    |
| L. | −0.076   | 0.12    |

H., M., and L. respectively represent high, middle, and low intensity of light illumination, Isc represents short circuit current and Voc represents open circuit voltage. From the data and the plot, it is obvious that the more intense the light illumination, the higher the short circuit current and the higher the open circuit voltage.

FIGS. 5–9 are I vs V plots of photoelectric conversion devices according to the present invention before and after the photoelectric conversion devices of various photo-receiving areas receive light of a certain intensity.

Figure 5:
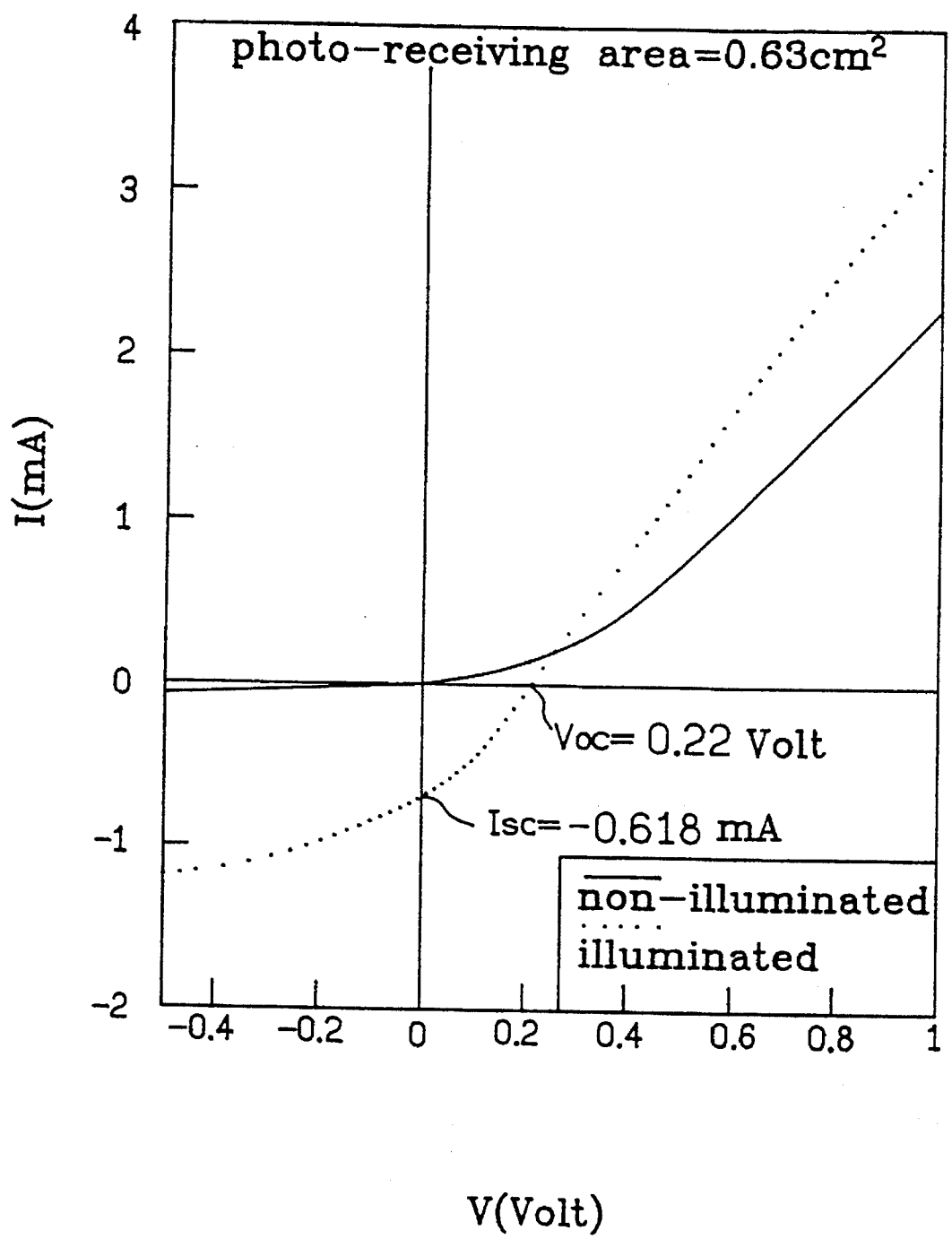
FIG. 5 is an I vs V plot of a photoelectric conversion device according to the present invention before and after the photoelectric conversion device which has a photo-receiving area of 0.63 $cm^2$ receives light of a certain intensity.

In the case shown in FIG. 5, wherein W×L=0.63 cm², the intensity of the light illumination is 40 W and the distance between the photoelectric conversion device and the bulb is about 15 cm, Isc=0.618 mA and Voc=0.22 V.

Figure 6:
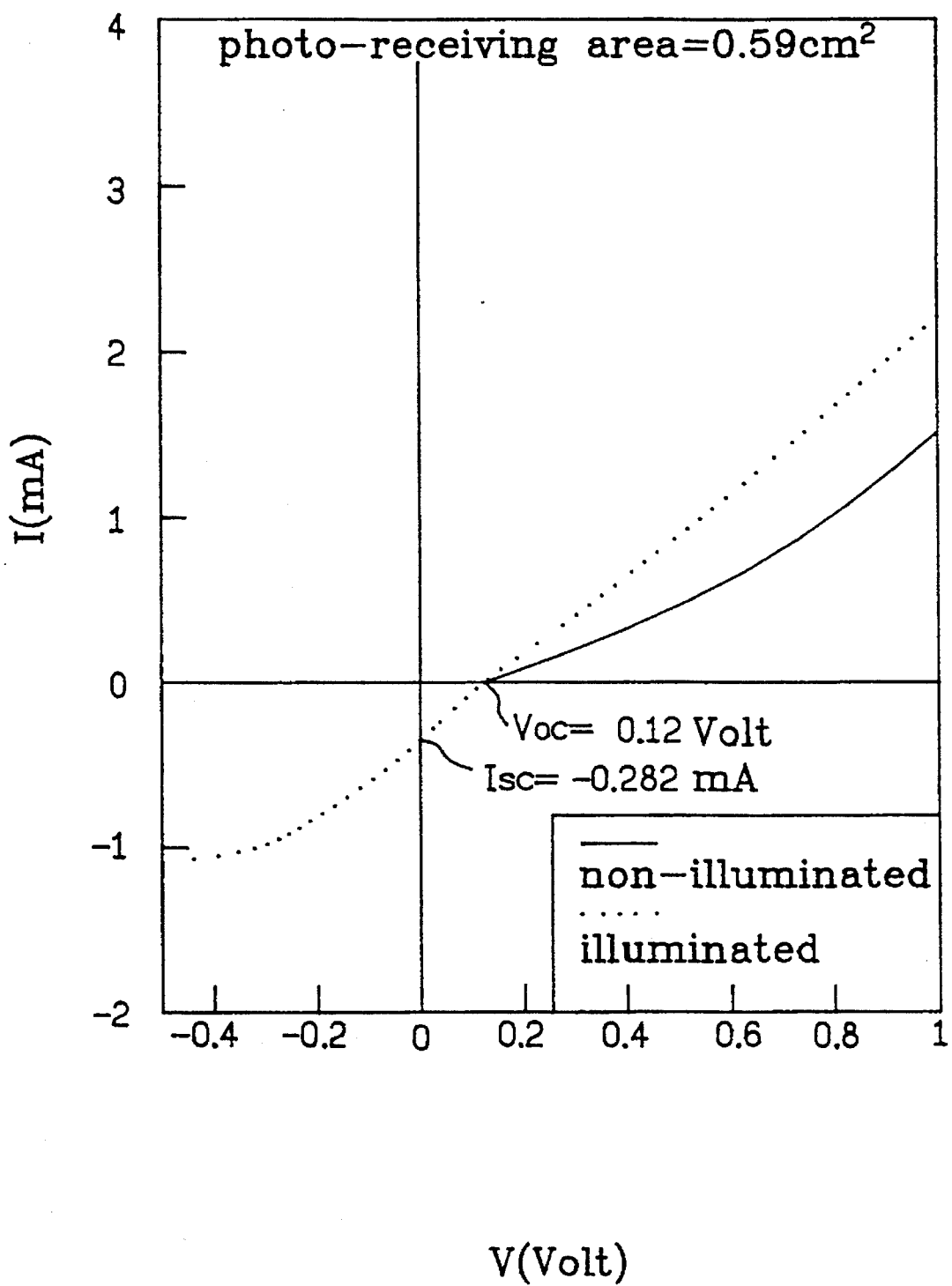
FIG. 6 is an I vs V plot of a photoelectric conversion device according to the present invention before and after the photoelectric conversion device which has a photo-receiving area of 0.59 $cm^2$ receives light of a certain intensity.

In the case shown in FIG. 6, wherein W×L=0.59 cm², the intensity of the light illumination is 40 W and the distance between the photoelectric conversion device and the bulb is about 15 cm, Isc=0.282 mA and Voc=0.12 V.

Figure 7:
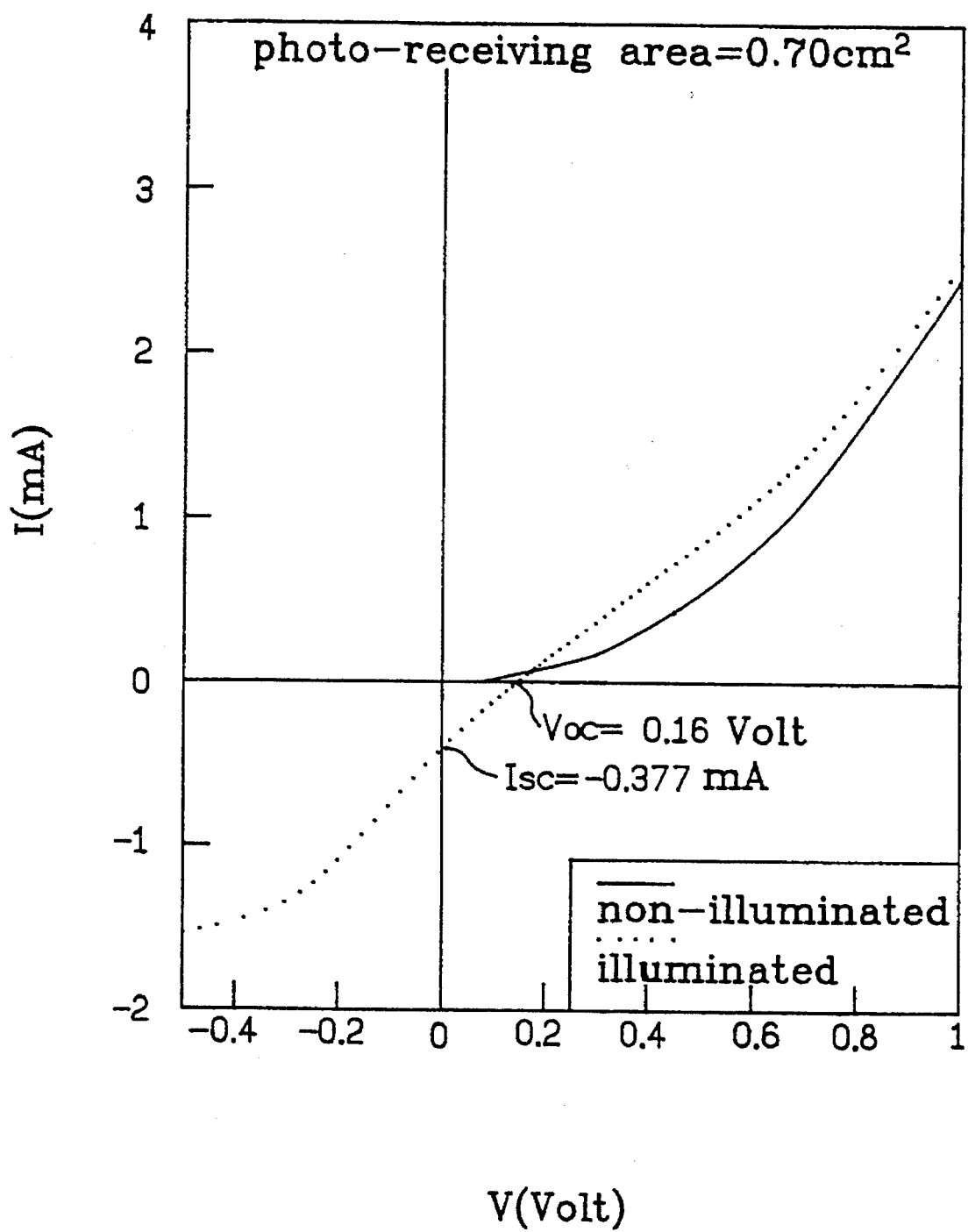
FIG. 7 is an I vs V plot of a photoelectric conversion device according to the present invention before and after the photoelectric conversion device which has a photo-receiving area of 0.70 $cm^2$ receives light of a certain intensity.

In the case shown in FIG. 7, wherein W×L=0.70 cm², the intensity of the light illumination is 40 W and the distance between the photoelectric conversion device and the bulb is about 15 cm, Isc=−0.377 mA and Voc=0.16 V.

Figure 8:
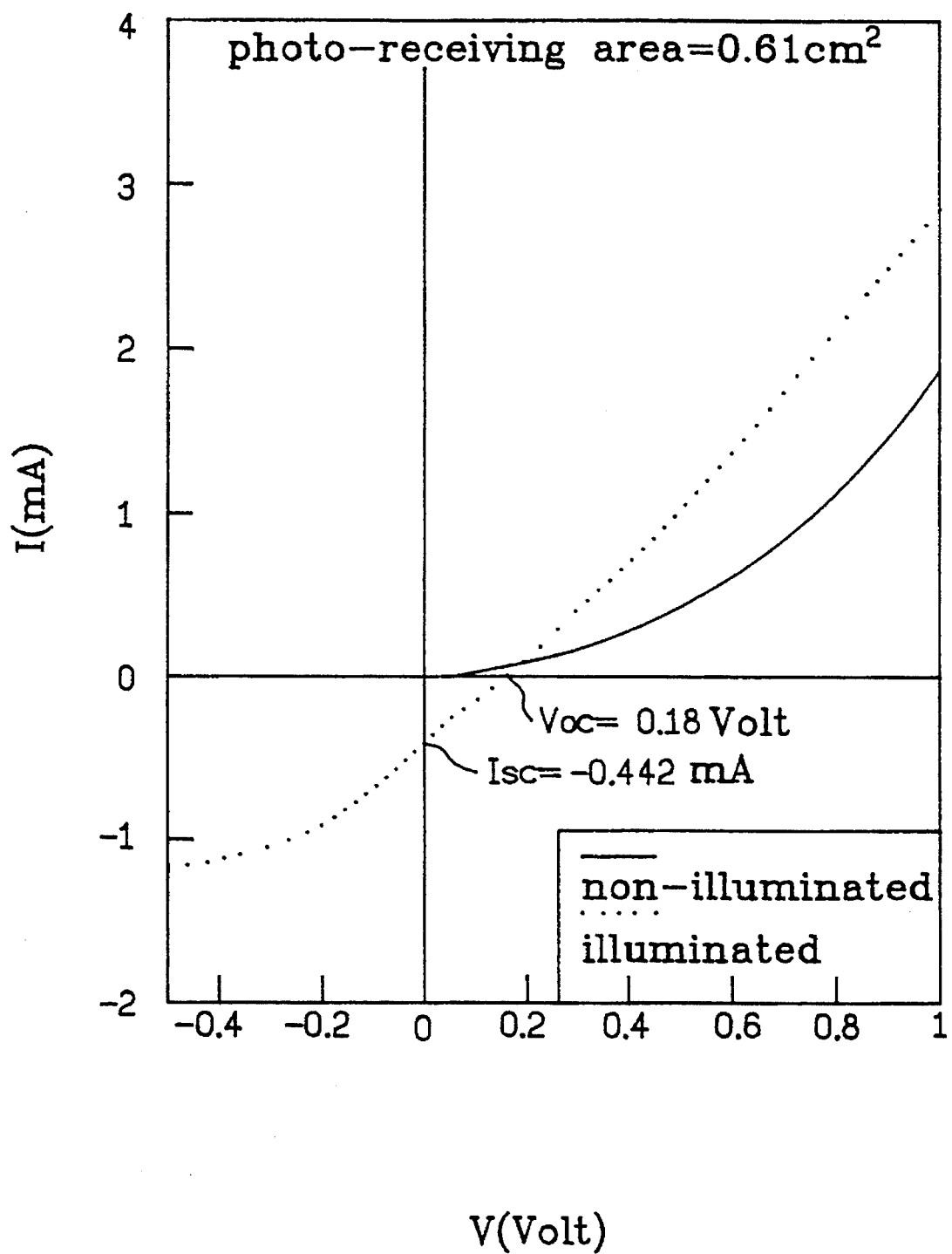
FIG. 8 is an I vs V plot of a photoelectric conversion device according to the present invention before and after the photoelectric conversion device which has a photo-receiving area of 0.61 $cm^2$ receives light of a certain intensity.

In the case shown in FIG. 8, wherein W×L=0.61 cm$^2$, the intensity of the light illumination is 40 W and the distance between the photoelectric conversion device and the bulb is about 15 cm, Isc= −0.442 mA and Voc=0.18 V.

Figure 9:
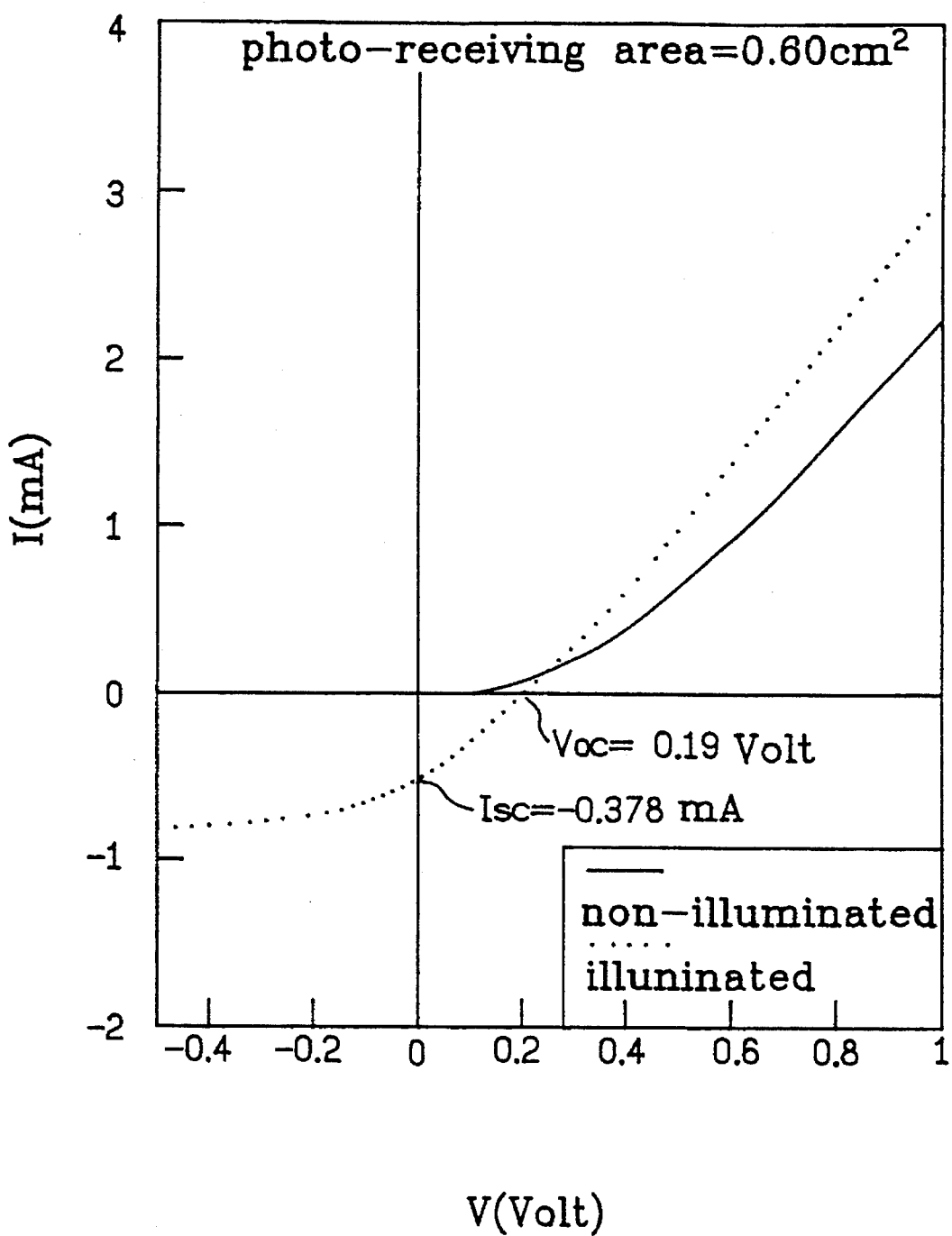
FIG. 9 is an I vs V plot of a photoelectric conversion device according to the present invention before and after the photoelectric conversion device which has a photo-receiving area of 0.60 $cm^2$ receives light of a certain intensity.

In the case shown in FIG. 9, wherein W×L=0.60 cm$^2$, the intensity of the light illumination is 40 W and the distance between the photoelectric conversion device and the bulb is about 15 cm, Isc=−0.378 mA and Voc=0.19 V.

Figure 10:
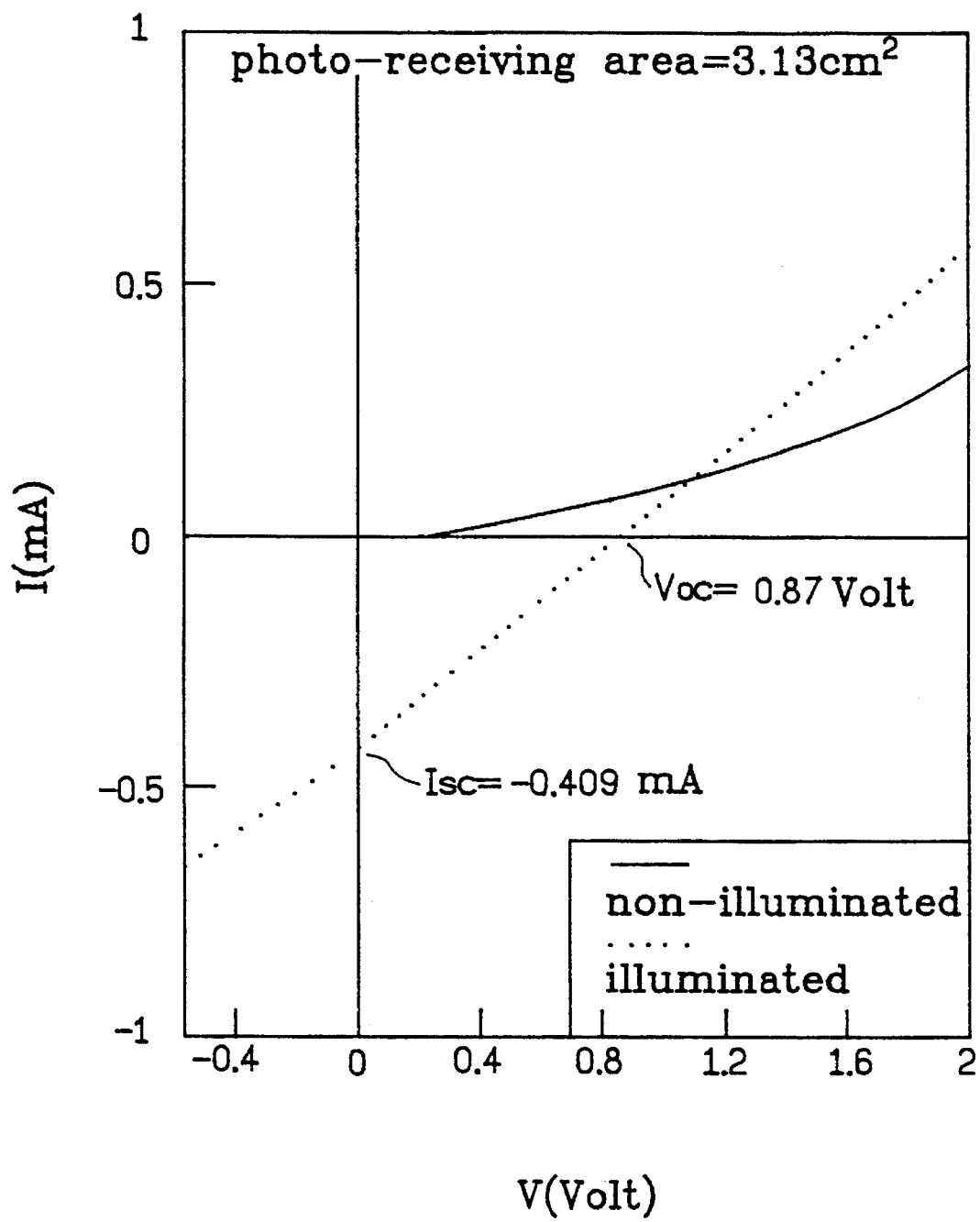
FIG. 10 is an I vs V plot of a group of the present photoelectric conversion devices which are connected in parallel, before and after the photoelectric conversion devices which respectively have photo-receiving areas of 0.63, 0.59, 0.70, 0.61 and 0.60 cm² receive light of a certain intensity.
Figure 11:
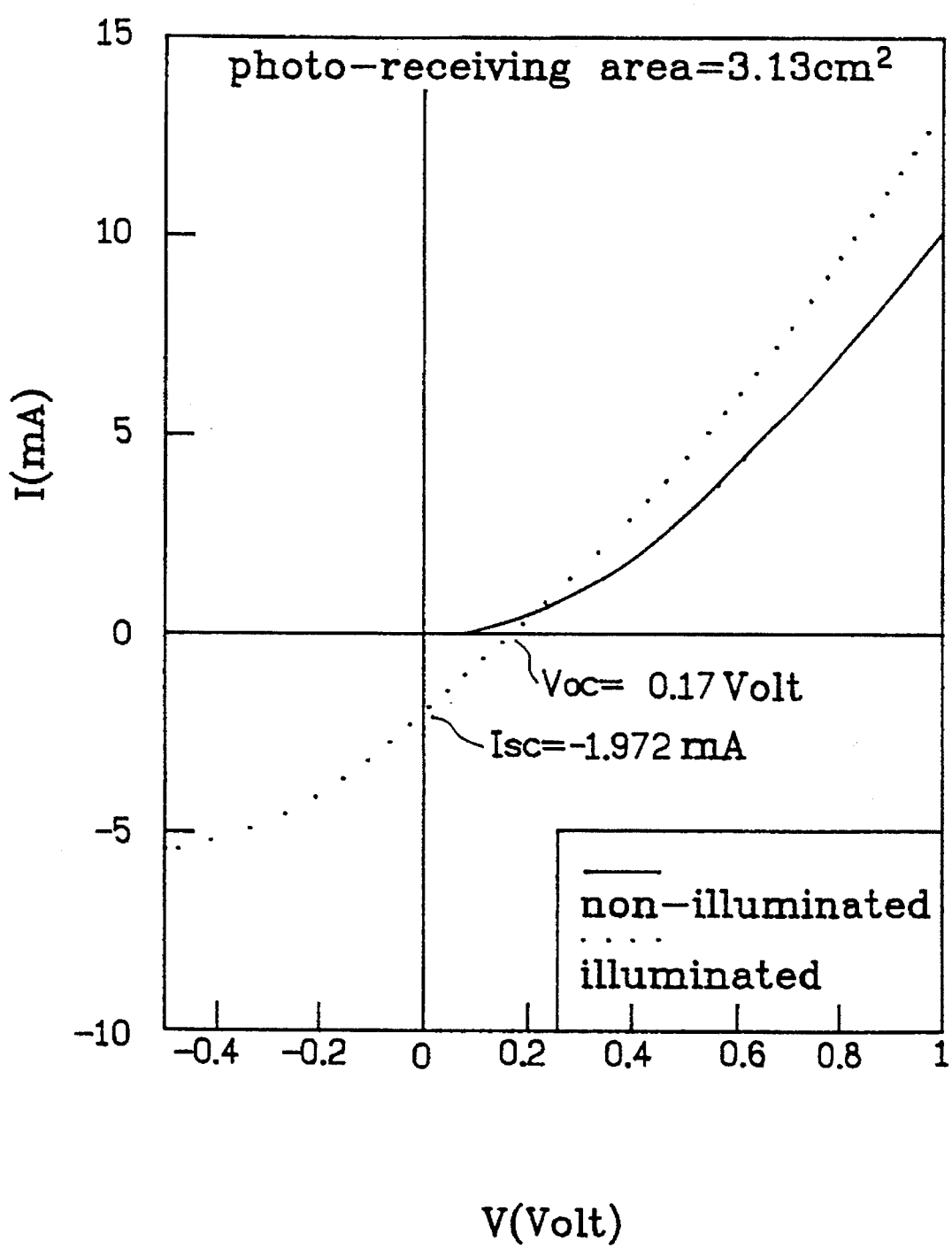
FIG. 11 is an I vs V plot of a group of the present photoelectric conversion devices which are connected in series, before and after the photoelectric conversion devices which respectively have photo-receiving areas of 0.63, 0.59, 0.70, 0.61 and 0.60 cm² receive light of a certain intensity.

FIG. 10 is an I vs V plot of a group of the present photoelectric conversion devices which are connected in parallel, before and after the photoelectric conversion devices which respectively have photo-receiving areas of 0.63, 0.59, 0.70, 0.61 and 0.60 cm$^2$ receive light of a certain intensity. Under the condition of equal intensity of light illumination and the same relevant distance, the obtained Isc and Voc are respectively equal to −0.409 mA and 0.87 V. Likewise, FIG. 11 is an I vs V plot of a group of the present photoelectric conversion devices which are connected in series, before and after the photoelectric conversion devices which respectively have photo-receiving areas of 0.63, 0.59, 0.70, 0.61 and 0.60 cm$^2$ receive light of a certain intensity. The obtained Isc and Voc are respectively equal to −1.972 mA and 0.17 V.

From the aforementioned results, a cell group having a certain output characteristic can be obtained by properly combining the present photoelectric conversion devices.

The present photoelectric conversion device (A) having an effective photo-receiving area of 3.6 cm$^2$ is compared with a conventional amorphous silicon solar cell (B) used in a commercially available calculator and having an effective photo-receiving area of 4.5 cm$^2$ to obtain the results as follows. The two devices are placed under the same light source with the same distances from the light source and the open circuit voltage (Voc) and the short current (Isc) are measured and listed in Table 2.

TABLE 2

|   | Isc | Voc |
|---|---|---|
| A | −0.14 ~ 0.17 | −3.1 |
| B | −0.16 ~ 0.17 | 2.9 ~ 3.0 |

From the results, it is shown that the present photoelectric conversion device having a smaller effective photo-receiving area has almost the same output as the conventional one. Therefore, the present invention has a high photoelectric conversion rate.

To summarize, the present invention uses a broken surface of a MOS-structure body to receive light and utilizes the principle of energy gap distortion to help the electron jump to generate the photoelectric conversion effect, so that it is quite different from the conventional solar cells.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A metal oxide semiconductor (MOS) photoelectric conversion device comprising:

a photo-receiving surface for generating electron-hole pairs due to a distortion in an energy band of a broken oxide surface thereof after receiving light, said broken surface obtained from an MOS-structure body, said photo-receiving surface including a silicon substrate and an oxide layer;

two contacts contacting said photo-receiving surface for separating said electron-hole pairs, and wherein said substrate is positioned between said two contacts and said oxide layer is positioned between said substrate and one of said contacts; and an anti-reflection layer covering said photo-receiving surface to reduce the light-reflection rate of said photo-receiving surface.

2. A photoelectric conversion device according to claim 1 wherein said substrate is a p-type silicon layer.

3. A photoelectric conversion device according to claim 1 wherein said substrate is an n-type silicon layer.

4. A photoelectric conversion device according to claim 1 wherein said oxide layer is a SiO$_2$ layer.

5. A photoelectric conversion device according to claim 1 wherein said contacts are respectively a first metal layer and a second metal layer.

6. A photoelectric conversion device according to claim 5 wherein said first metal layer is an aluminum layer.

7. A photoelectric conversion device according to claim 5 wherein said second metal layer is an aluminum layer.

8. A photoelectric conversion device according to claim 1 wherein said device is a solar cell.

9. A photoelectric conversion device according to claim 1 wherein said device is a photo detector.

10. A photoelectric conversion device according to claim 1 wherein said broken surface is obtained by cutting said MOS-structure body.

11. A photoelectric conversion device according to claim 1 wherein said broken surface results from a natural cleavage of said MOS-structure body.

12. A method for manufacturing an MOS photoelectric conversion device comprising the steps of:

(a) providing a silicon substrate having an upper surface and a lower surface;

(b) growing an oxide layer on said upper surface;

(c) forming a first metal contact layer on said oxide layer;

(d) forming a second metal contact layer on said lower surface of said silicon substrate to obtain an MOS-structure body; and (e) breaking said MOS-structure body into several parts each having a broken surface to serve as a photo-receiving surface to generate electron-hole pairs after said photo-receiving surface receives light.

13. A method according to claim 12 wherein said oxide layer in said step b) is grown in a dry oxygen atmosphere at 1000° C.

14. A method according to claim 12 wherein said step c) is performed by evaporating.

15. A method according to claim 12 wherein said step d) is performed by evaporating.

* * * * *